United States Patent [19]
Andrusch et al.

[11] Patent Number: 4,713,814
[45] Date of Patent: Dec. 15, 1987

[54] STABILITY TESTING OF SEMICONDUCTOR MEMORIES

[75] Inventors: Georg Andrusch, Herrenberg; Joachim Baisch, Nufringen; Horst Barsuhn, Holzgerlingen, all of Fed. Rep. of Germany; Friedrich C. Wernicke, Fishkill; Siegfried K. Wiedmann, Millwood, both of N.Y.

[73] Assignee: International Business Machines Corporation, Armonk, N.Y.

[21] Appl. No.: 839,315

[22] Filed: Mar. 13, 1986

[30] Foreign Application Priority Data

Mar. 29, 1985 [EP] European Pat. Off. ......... 85103736.6

[51] Int. Cl.$^4$ ............................................. G06F 31/28
[52] U.S. Cl. ....................................... 371/21; 365/201; 365/200; 371/20
[58] Field of Search .................... 371/25, 21, 28, 20; 365/201, 200, 228, 227, 226

[56] References Cited

U.S. PATENT DOCUMENTS

| | | | |
|---|---|---|---|
| 3,995,215 | 11/1976 | Chu et al. | 324/158 |
| 4,004,222 | 1/1977 | Gebhard | 324/158 |
| 4,418,403 | 11/1983 | O'Toole et al. | 365/201 |
| 4,430,735 | 2/1984 | Catiller | 371/25 |
| 4,502,140 | 2/1985 | Prochsting | 371/21 |
| 4,503,538 | 3/1985 | Fritz | 371/21 |
| 4,553,225 | 11/1985 | Ole | 371/21 |
| 4,606,025 | 8/1986 | Pekis | 371/21 |
| 4,608,669 | 8/1986 | Klara | 365/201 |
| 4,612,630 | 9/1986 | Rosier | 365/201 |

FOREIGN PATENT DOCUMENTS 1569800 6/1980 United Kingdom.

OTHER PUBLICATIONS

S. K. Wiedmann "Advancements in Bipolar VLSI Circuits and Technologies in IEEE Journal of Solid-State Circuits vol. SC-19 No. 3 Jun. 1984 pp. 282-290.

S. K. Wiedmann, F. Wernicke et al. "Injection-Coupled Logic Leads Bipolar RAMs to VLSI" in Electronics, Feb. 23, 1984, pp. 139-143.

G. Boudon, "Storage Cell Disturb Test for Harper Cell Memory" in IBM Technical Disclosure Bulletin (TDB) Feb. 1979 vol. 21 No. 9 pp. 3659-3660.

K. Heuber et al. "Storage Cell Disturb Test" in IBM Technical Disclosure Bulletin (TDB) Jan. 1978 vol. 20 No. 8 pp. 3175-3176.

E. C. Jacobson "Word-Line Failure Detection Circuit" in IBM Technical Disclosure Bulletin (TDB) Apr. 1977 vol. 19 No. 11 pp. 4197-4198.

S. K. Wiedman, K. H. Heuber "A 25ns 8K×8 Static MTL/I$^2$L RAM", in IEEE Journal of Solid State Circuits, vol. SC-18, No. 5, Oct. 1983, pp. 486-493.

Primary Examiner—Michael R. Fleming
Attorney, Agent, or Firm—Stephen J. Limanek

[57] ABSTRACT

Design/test technique to facilitate improved long-term stability testing of static memory arrays with high inherent data retention characteristics at extremely small standby current requirements. The test concept is based on the fact that defects in the standby condition system of a memory array have a bearing on the word line standby potential. Detection of word line potentials differing from their nominal value defined for the standby state, i.e., in the unselected operation mode, is accomplished by performing a disturb write operation into the partly or totally unselected array. As a result cells along a defective word line are less disturbed than those along a goood or normal word line. This inverted error pattern is used for screening defect word lines which otherwise would show up as long-term data retention problems.

14 Claims, 4 Drawing Figures

STABILITY TESTING OF SEMICONDUCTOR MEMORIES

DESCRIPTION

1. Technical Field

The invention relates to an improved long-term dc stability design/test technique for integrated semiconductor memories with static memory cells exhibiting high data retention properties.

2. Background Art

With the increasing integration density of semiconductor memories testability of all storage functions of a chip is becoming a likewise increasing problem. For complex logic chips it is already now quite conventional to spend substantial effort at the chip design level to facilitate comprehensive testing at later stages. In the field of semiconductor memory development and production numerous test sequences are commonly carried out to check the functionality of the respective memory chip during various read/write operations subject to a great many parameters like temperature, power supply and signal level tolerances, timing variations, test patterns, etc. In general that can be performed within relatively short testing times of about a few seconds. For dynamic memories the long-term stability of the corresponding memory cells is checked by what is called real-time refresh tests which due to the relatively short refresh time also require reasonably short testing times.

As the development in the static memory field has lead to storage cells with an inherent long data retention time, testing the long-term stability has become a specific problem. More and more the static type cells allow operation at extremely small power dissipation which is achieved, for instance, by providing complementary load devices as is the case with memory cells of the merged transistor logic/integrated injection logic, MTL/I$^2$L, type. A more detailed description of this type of memory is given in the following literature cited here expressly for later reference:

- S. K. Wiedmann: "Advancements in Bipolar VLSI Circuits and Technologies" in IEEE Journal of Solid-State Circuits, Vol. SC-19, No. 3, June 1984, pp. 282 to 290. Especially in chapter IV "The Evolution of Memory Device Concepts" starting on page 285, a comprehensive overview (with further references) is given on memories of the afore-mentioned type, i.e. injection-coupled cell, injector-sensed cell, Low-R injection-coupled cell, split-emitter cell, etc. Later reference in this patent application will be based on these designations, the corresponding circuit diagrams, layout schematics, etc.

- S. K. Wiedmann, F. Wernicke et al: "Injection-coupled logic leads bipolar RAMs to VLSI" in Electronics, Feb. 23, 1984, pp. 139 to 143, and GB patent No. 1 569 800 to S. K. Wiedmann/IBM. Both references refer to MTL logic and memory structures taking advantage of the back-injection phenomenon for sensing (e.g., injector-sensed cells).

- S. K. Wiedmann, K. H. Heuber: "A 25 ns 8K×8 Static MTL/I$^2$L RAM" in IEEE Journal of Solid-State Circuits, Vol. SC-18, No. 5, Oct. 1983, pp. 486 to 493. This article refers in more detail to the above-mentioned Low-Resistance (Low-R) injection-coupled cell type.

While very small power dissipation is an otherwise extremely attractive feature of an integrated semiconductor memory, the specific problem those memories raise with regard to testability lies in that very fact, i.e., that even being disconnected from their power supply these memory cells are able to maintain their stored information up to several minutes (to give an idea of the order of magnitude). For cost and other reasons it is, however, obvious that the complete chip testing time should be as short as possible and in any case require no more than a few seconds. Conventional methods for checking the long-term stability by carrying out pause- or long-cycle-tests are thus no longer optimal with data retention times in the minute-range being offered by memory cells of the afore-mentioned type.

Further it has to be noted that memory cells of such extreme stability are being refreshed by each address step or even half-select operation in the course of normal read/write functional tests; i.e., principally these memories can be operated during those tests even without ordinary cell standby current supply.

From the above it is apparent that a defect in the memory standby condition supply system can lead to very intricate reliability problems because they are unlikely to be discovered in the course of normal test procedures. Due to manufacturing defects one cannot, however, exclude as one potential defect cause that merely the standby current supply for a memory cell or a group of cells is, for instance, interrupted although the respective memory chip did pass all traditional functional tests.

The following prior art references are regarded typical representatives of conventional testing techniques as mentioned above.

IBM Technical Disclosure Bulletin (TDB) Vol. 20, No. 8, Jan. 1978, pp. 3175/3176, and IBM TDB Vol. 21, No. 9, Feb. 1979, pp. 3659/3660, refer to storage cell disturb tests where a specific test pattern sequence is applied to ensure that storage cells will not disturb each other during normal operation.

IBM TDB Vol. 19, No. 11, Apr. 1977, pp. 4197/4198 relates to a word-line failure detection circuit which by virtue of an additional bit line with an associated sense circuit ensures non-activated data outputs upon the occurrence of word-line failures of either the open circuit or short circuit type.

U.S. Pat. No. 4,418,403 is directed to a semiconductor memory cell margin test circuit comprising means interconnected to a word line for varying the voltage applied to the word line without varying the supply voltage to test for proper functioning of the memory cells along a row of the memory while operating with reduced voltage on the selected word line.

U.S. Pat. No. 4,004,222 describes a test system for semiconductor memory cells where the leakage current from certain nodes is accelerated so that defective cells which would not be detected without a considerable waiting period elapsing, are readily quickly detected.

U.S. Pat. No. 3,995,215 refers to a test technique for semiconductor memory arrays; included is the testing of the load devices in a flip flop cell which is connected to a pair of bit lines that are inaccessible for the direct application of test signals. Testing is performed by altering the time duration of signals applied to the memory cells under test.

DISCLOSURE OF THE INVENTION

An object of this invention as claimed solves the problem of how to devise an effective design/test technique to facilitate improved long-term stability testing of static memory arrays with high inherent data retention properties at extremely small standby current requirements.

In summary, the invention is based on the fact that defects in the standby condition system of a memory array have a bearing on the potential of the selection lines, for instance, the word lines, during the standby state. Detection of selection line potentials differing from their nominal value defined for the standby condition, i.e., in the unselected operation mode, is accomplished by performing a disturb write operation into the partly or totally unselected array. As a result cells along a defective word line are less disturbed than those along a good or normal one. This fact (resulting in an "inverted error pattern") is used for screening defect word lines which otherwise would show up as (long-term) data retention problems. Due to the afore-mentioned intricacy of the failure mechanism, defects of that kind would probably remain undiscovered until some later time and possibly until after delivery or incorporation in a computer system by the customer.

More particularly the invention provides a method of testing static semiconductor memories with inherent high data retention characteristics for defects in a standby system of the memory with the memory being provided typically in matrix form as an array of cells arranged at crosspoints of associated word and bit lines. The method includes the steps of storing binary information in the cells in a given state, energizing the word lines to place them in a standby mode to maintain the word lines and the cells in an unselected state, performing via associated bit lines a disturb write operation while the word lines are in the unselected state and checking the storage state of the memory cells subjected to the disturb write operation, whereby a change in storage state of a cell along a word line is indicative of a defect free standby supply system of the particular word line, whereas the presence of the initial storage pattern in cells along a word line under test is indicative of a failure or defect in the standby supply system of that particular word line.

The foregoing and other objects, features and advantages of the invention will be apparent from the following more particular description of the preferred embodiments of the invention, as illustrated in the accompanying drawings.

BEST MODE FOR CARRYING OUT THE INVENTION

As stated earlier modern semiconductor memory arrays with long data retention characteristics pose specific problems as to the reliable and speedy testing of their long-term stabiliy. A decisive factor of the long-term stability is, of course, that the memory standby system is in order. In this context the word line (WL) potential plays an important role.

Modern VLSI integrated circuits rely to a large extent on what is called multi-layer chip wiring. One type of failure associated with this technology is short circuits between two conductive layers (so-called interlevel shorts ILS) when the isolator between the two layers shows pinholes or other defects. These ILS defects can cause an increased potential on a respective word line. Typically an increased word line potential effects a reduction of the cell standby current which in turn leads to marginal cell stability with a subsequent loss of the data stored. A raising of the standby potential can also occur in those cases where, for instance, owing to process defects the connection between word line and standby current source is interrupted. In storage cells with long data retention time as referred to in the above prior art section, the information entered into the cells is maintained for a very long time in spite of drastically reduced/missing standby currents. For that reason, tests with intervals that can extend over up to several minutes would have to be applied for finding chips with the above described error mechanism. Such time-consuming tests, however, are generally not acceptable for today's mass production. The current invention is to permit the finding of word lines with increased potential in a short-time test.

Figure 1:
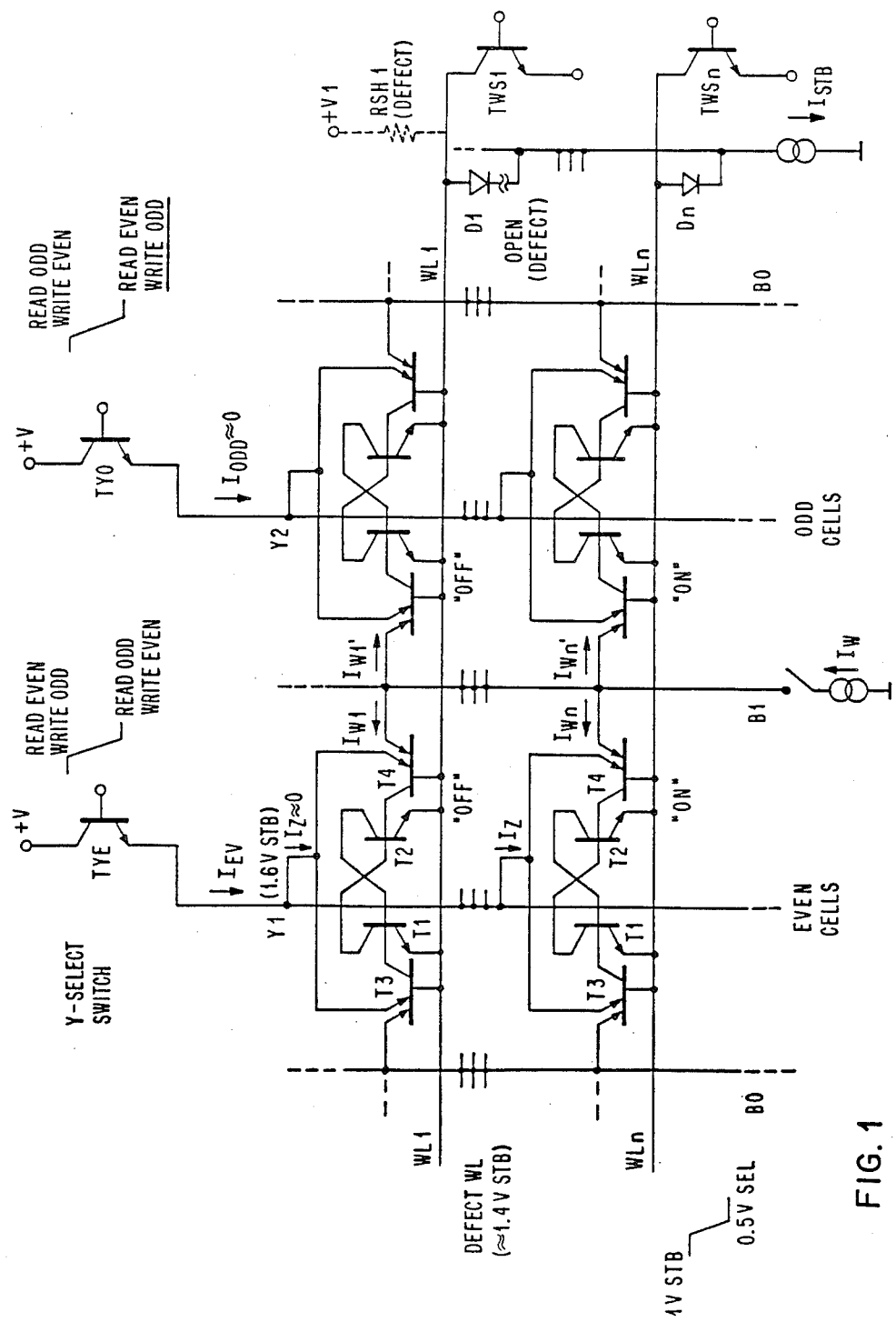
FIG. 1 illustrates part of a matrix of injection-coupled cells of a first type with defects in the word line standby potential system.

For illustrating the invention, reference is made to the storage matrix of FIG. 1 which uses memory cells of the type referred to earlier as Low-R injection-coupled cells. For a general description of the complete array circuitry as well as the normal read/write operations reference is made to the comprehensive description cited earlier. FIG. 1 indicates four memory cells although a complete memory chip would contain as many as some tens of thousands of such cells. Each cell comprises (in this case) flip flop transistors T1 and T2 which according to the known MTL/I$^2$L technology are formed by inversely operated transistor structures. Further transistors T3 and T4 are of the complementary conductivity type, i.e., in this case of the PNP type. Transistors T3 and T4 provide the load and access devices. Two word lines WL1 and WLn are indicated as being selectable by word line switch transistors TWS1 and TWSn, respectively, providing the X-selection. The Y-selection is performed through transistor switches TYE and TYO, E standing for selection of the Even cells and O standing for selection of the Odd cells. Each column of memory cells is accessible in the Y-direction via bit lines B0 & B1, B1 representing in this organization with even/odd cells a so-called shared bit line. For the sake of facilitating the understanding of the invention, particulars of the complex peripheral circuitry for operating such a memory are deliberately omitted. For example, the select switches are merely indicated as transistors although in reality much more complex circuitry is involved. A complete description of such a memory including circuit diagrams, layout schematics and a description of the memory operation is given in the afore-mentioned article in the IEEE Journal of Solid-State Circuits, Oct. 1983, pp. 486 ff.

In FIG. 1 it is assumed that the standby current supply for word line WL1 is interrupted as indicated by the open in the connection between WL1 via D1 (indicating the standby current switch) and the standby current source $I_{STB}$. In this case, the standby current supply for the other word line WLn via Dn is practically not affected. This defect (referred to in the following also as WL-open) does not affect the normal read/write operation of the memory. As already mentioned the storage cells are able to maintain their stored information up to a hundred seconds or even more subsequent to each addressing.

According to the invention testing whether all memory cells are connected to the standby current source is accomplished by means of the following measures. Differing from the normal operation, all word lines (at least the word lines of a group to be tested) are kept in their standby condition (WL unselected) when addressing the memory chips. That can be performed, for instance, by deactivating the word decoder by means of a specific control signal applied in the course of the test. The bit switch circuits, however, are activated as during a write operation whereby one or more bit line pairs may be selected simultaneously. Resulting from this, all cells along a bit line pair are "written" in the same fashion—but only if and when the associated cells are ordinarily connected to the standby supply. This is an important prerequisite in the context of the present invention. The write operation performed so far is substantially the same as during a normal write operation of a single cell of the selected bit line pair.

If the standby current supply to WL1 is interrupted (as indicated in FIG. 1) then the write current $I_{W1}$, for the odd-cell in the upper right, for example, is zero, i.e. the state of this cell is not changed but its original information is maintained. In all remaining memory cells with proper standby current supply, write current $I_W$ flows via the cells into the word line standby supply source eventually effecting these cells to change their storage state after some time. By virtue of maintaining the standby condition (unselected state) this kind of (disturb) write operation will generally require more time than a normal write operation in the select-state because the write current for a single memory cell is considerably smaller in the standby state. Nonetheless the time period involved with this disturb write is by several orders of magnitude smaller than the long-term stability of this kind of memory cell.

To state the above effect differently, an increased WL standby potential which is indicative of the type of defects to be screened out by the invention results in all cells along this word line to be subjected to a smaller disturb current than the cells connected to a "good" or normal word line WL. That means cells along a defective word line are able to retain their storage states during the disturb period for a longer time than cells along a good or normal word line. The present invention takes advantage of this effect to facilitate the improved anticipation of the very intricate defect phenomena associated with a failure in the standby supply system. In contrast to conventional procedures this type of test generates changing states in all functioning cells while all cells along a "bad" or defective word line (i.e., cells leading to failures during normal operation) stay unchanged (inverted error pattern).

Instead of or additional to the above assumed failure type (WL open) there may be other defects that have a bearing on the standby current supply. As representative of another defect of that type, FIG. 1 indicates a short between WL1 and a positive voltage supply V1, which short is indicated by resistor RSH1. By this short the respective word line WL1 can assume a substantially higher standby potential than nominal; this directly jeopardizes current supply of the associated cells.

Despite such a short, normal read/write operations may be performed if the associated word select switch (in this case TWS1) is able to carry a sufficiently high "short circuit" current from V1 via RSH1). By the standby/disturb write test of the present invention defects of that type are readily detectable, too.

Figure 2:
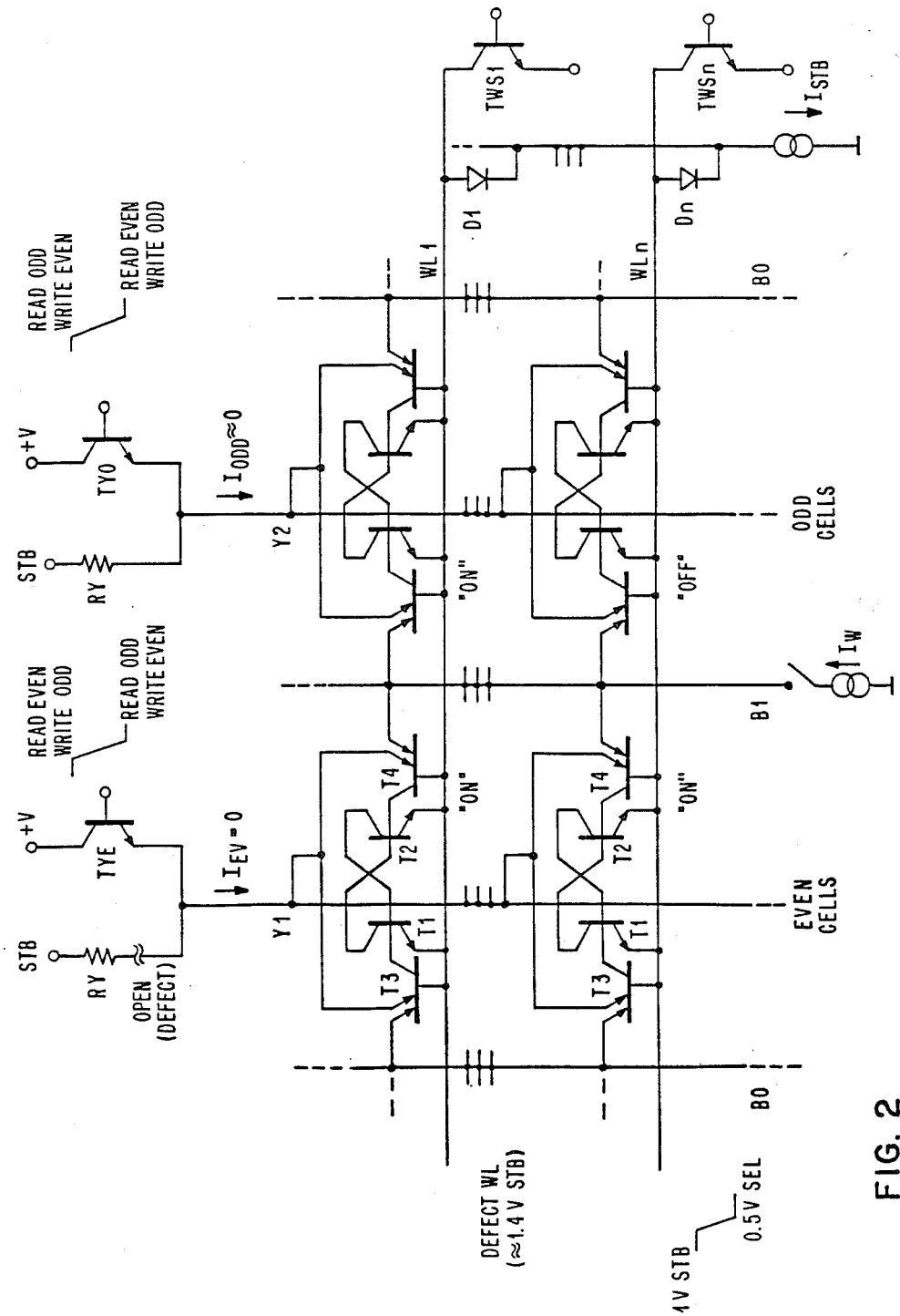
FIG. 2 illustrates the interruption of the standby current supply at the positive (injector) end of memory cells of the same type as in FIG. 1.

FIG. 2 shows substantially the same memory cell arrangement as in FIG. 1 but illustrates still another defect type which may occur in the standby system. The defect type assumed in FIG. 2 is an interruption of the cell standby current supply at the positive cell terminal(s) indicated as Y1 and Y2, i.e., at the injector's side of the particular memory cells. In the arrangement of FIG. 2 the positive cell current is not applied via Y-select switches indicated by TYE and TYO but via a separate supply which is schematically indicated by a resistor (RY)-connection to a respective supply terminal designated as STB. A failure of this type, too, can be detected by the standby/disturb write test of the present invention.

Figure 3:
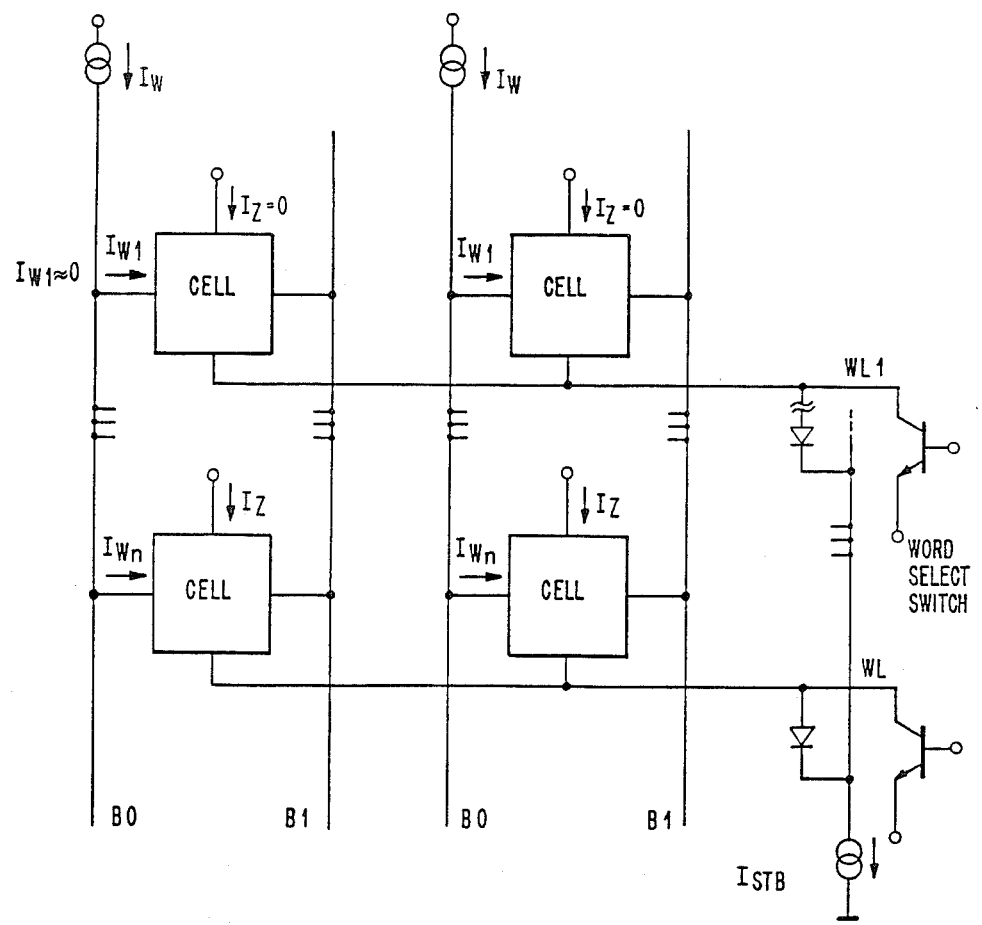
FIG. 3 shows a simplified memory matrix schematic for the standby/disturb test proposed.

The proposed test may be further optimized (minimum testing times) by increasing the standby current of the cell and/or the disturb-write current in the bit lines by means of external control signals for operating the memory chip under test. For implementing the above outlined test only a few additional control gates and an additional testing pad may be required. As will be described later in more detail it is even possible to take advantage of corresponding control signals already available for the normal chip operation. Further it should be stated again that the described method is applicable for a wide range of storage cell types as indicated earlier in more detail. In fact it is applicable for substantially all static bipolar or FET integrated memories with inherent long-term data retention properties under drastically reduced standby power dissipation conditions. For a more generalized block diagram of the circuit schematic for the proposed standby/disturb write test of such a memory matrix reference is made to FIG. 3. The blocks representing the memory cells in FIG. 3 may be replaced by any of the earlier mentioned cell diagrams/structures. In all other respects the block diagram of FIG. 3 represents a generalization of the arrangement of each of the earlier FIGS. 1 and 2, wherein like designations stand for like subjects or elements.

Figure 4:
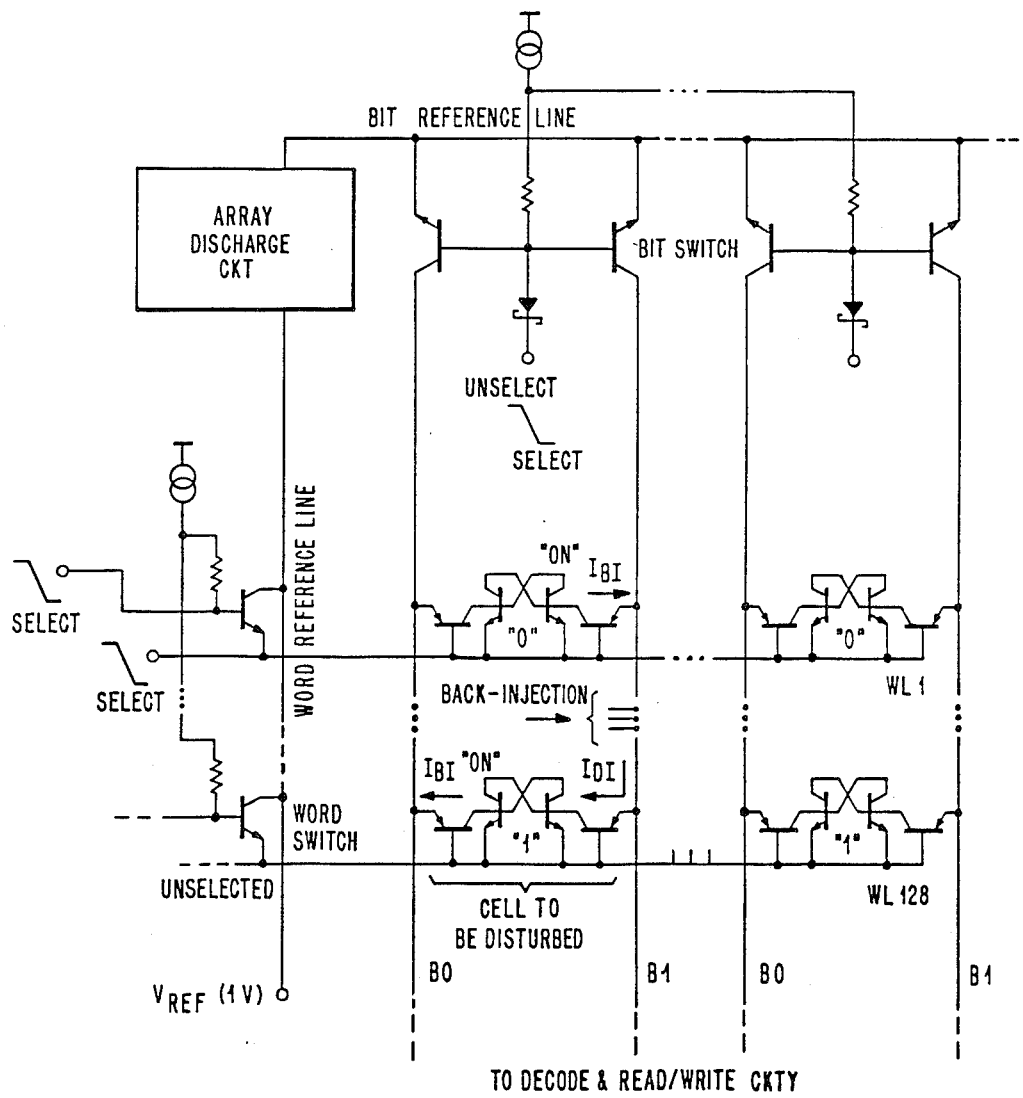
FIG. 4 shows the write-disturb test conditions in case of an array of injector-sensed cells and aking advantage of the back injection effect for providing the disturb current.

To illustrate a further embodiment of the invention, FIG. 4 shows part of an array of injector-sensed cells, which array is described in more detail in the aforementioned article in Electronics/Feb. 23, 1984, pp. 139 ff. and further the subject of applicants' GB patent No. 1 569 800. Regarding the cell structure, the layout schematic and the conventional support circuitry, as well as the normal read/write operation sequence, express reference is made hereby to that article.

The memory array indicated schematically in FIG. 4 comprises 128 word lines running in the X-direction and designated WL1 to WL128. The memory cells in each column are accessible via bit line pairs B0, B1 running in the Y-direction. Again, the failure to be focused on by the testing method according to the invention is a defect in the word line standby supply system resulting in an increased word line potential during standby. Whereas in the earlier described embodiment of the invention there were provided specific dc disturb write current sources ($I_W$), in FIG. 4 for providing a suitable disturb current $I_{DI}$, the invention takes advantage of the so-called back-injection effect. The back-injection effect is comprehensively described in the afore-mentioned literature; it means that minority carriers are re-injected from the base of an "ON" NPN transistor to the associated bit line(s). In the injector-sensed cell this phenomenon is used for the read-out of the information stored in the cell.

For the purpose of illustrating this particular embodiment of the invention, in FIG. 4 it is assumed that word line WL128 is to be checked. That means that WL128 is maintained in the unselected state as are the remaining word lines WL1 to WL127. As in the corresponding select mode, the bit switches of the particular bit line pair(s) are kept in their non-conducting state. Further it is assumed that all memory cells connected to word lines WL1 to WL127 have a "0", for instance, written as storage information, whereas the cells along WL128 are written to contain the opposite storage information, i.e., "1". As is indicated in the upper left cell of FIG. 4, a stored "0" is represented by the right flip flop transistor of the cell being in its "ON" state, thus, re-injecting current $I_{BI}$ to bit line B1. The same applies for the remaining cells along that bit line pair down to word line WL127 (not shown). The accumulated back-injection, due to the opposite storage state assumed by the lower left cell at the intersection of WL128 and the mentioned bit line pair B0/B1, represents the required disturb write current designated $I_{DI}$ which is required for subjecting this cell to the afore-mentioned disturb write test. If the standby potential of WL128 were increased (indicative of a failure in the standby supply system of WL128) this cell would be exposed to a smaller disturb current than a cell connected to a word line with the nominal (lower) standby potential. As a result, with an elevated standby potential on WL128 the cell would keep its information longer than a cell attached to a "good" or normal word line.

In this connection it is to be noted that in conventional memory arrays the afore-mentioned specific conditions for performing a write operation while keeping the associated word line in its unselected mode, would be not normally possible without providing for modifications in the operational array cycles. In those cases it is, however, often possible to first proceed with a normal select operation selecting both a bit line pair and a word line, and subsequently performing a forced de-select step of the particular word line to be tested. This de-select step can either be triggered internally or by means of an externally provided control or clock signal.

To summarize the afore-mentioned test procedure a typical test sequence could be the following:
(1) Begin initialization of the array by writing a "0" (or "1") in each of the array bit positions.
(2) Write a "1" (or "0") in the first word line along all bit addresses.
These are "normal" write operations with, for example, a 100 ns cycle.
(3) Perform a write operation for a "0" (or "1") along all bit addresses as disturb cycle (no WL selected) with, for example, 500 μs cycle time.
(4) Read the "1" (or "0") in the first word line which have been disturbed.
(5) Repeat this procedure for each of the remaining word lines.

To screen out potential "Zeroes only" and "Ones only" defect cells, it may be advantageous to repeat the above test using the complement data.

Taking advantage of the back-injection phenomenon is a particularly advantageous form of (generally stated) applying a dynamic or ac current for the disturb write step. To provide an ac disturb current, other dynamic effects, e.g., capacitive discharge phenomena etc., could be used as well. It should be further kept in mind that the larger the disturb current that can be provided, the more associated cells and thus word lines can be tested simultaneously. An increased disturb current may be obtained if the standby potentials or currents are brought-up to values higher than nominal in a cycle directly preceding the disturb cycle.

The effectivity of the test may further be increased by appropriate selection of the bit pattern. As stated above, a cell is subjected to a disturb effect only when the disturb information is complementary to the information stored initially. This condition may apply for all cells along the investigated bit line pair; it may as well be only one single cell for which this holds true. In the latter case the disturb effect is strongest because the accumulated back-injection current of the remaining cells contributes to increase the resultant disturb current (as shown in FIG. 4).

Of course, the test itself may be simplified if for each bit line pair a particular dc disturb current source (e.g., read/write current source) is available (or is already provided for in the design of that specific array chip) to particularly meet the stated test requirements as was assumed in the embodiments of FIGS. 1 to 3. This would furthermore increase the general applicability of the proposed design/test principle. Since in this case a constant and well defined disturb current is available, the cells along a bit line pair need not be tested in subsequently performed cycles but all cells connected to the selected bit line pair can be subjected to the write disturb test in one single cycle.

The time required for the test may be shortened if only parts of all the bit line pairs are subjected to the write disturb test. Where, for instance, the array is organized in, say, 10 channels with each channel comprising a certain group of bit line pairs, only the cells at the left and right ends of each channel need to be tested thus reducing the required test time to about 1/10. Theoretically it would be sufficient if only two bit line pairs in two different channels were tested.

The described standby/disturb write test has shown to provide a very successful and speedy test for uncovering failures in the word line standby supply system of static memory arrays with inherent high data retention characteristics. Memory cells of this type are increasingly developed in the course of the VLSI technology trend, and failures of the described type would lead to very intricate long-term stability problems if left uncovered. The proposed test/design concept has proved to provide an effective tool to screen out these defects at an early stage.

While the invention has been particularly shown and described with reference to preferred embodiments thereof, it will be understood by those skilled in the art that various changes in form and details may be made therein without departing from the spirit and scope of the invention.

What is claimed is:
1. A method of testing a static semiconductor memory with inherent high data retention characteristics for defects in a standby supply system of said memory, said memory being provided typically in matrix form as an array of memory cells having bit positions arranged at the crosspoints of associated word and bit lines, said method comprising the steps of:

storing binary information in said cells in a given state, energizing said word lines so as to place said word lines in a standby mode to maintain said word lines in an unselected state, performing via associated bit lines with said cells in said given storage state during said standby mode a disturb write operation of said cells, and Checking subsequently for the memory cells subjected to the standby/disturb write operation the actual cell states, whereby a change along a word line of the given storage state of one of sid cells is indicative of a defect-free standby supply system of the particular word line, whereas the presence of the given storage state of one of said cells along a word line under test is indicative of a failure in the standby supply system of that particular word line.

2. A method as set forth in claim 1 wherein said disturb write operation is performed for the cells of the array simultaneously, with all cells being maintained in an unselected state with regard to their word line selection.

3. A method as set forth in claim 1 wherein disturb write current is being supplied from one or more dc current sources.

4. A method as set forth in claim 1 wherein said disturb write operation is performed for part of said memory array with only groups of memory cells being kept in an unselected state with regard to their word line selection.

5. A method as set forth in claim 4 wherein as disturb write current an ac response current is used which is derived from an array part operated in normal full-select fashion.

6. A method as set forth in claim 4 wherein as disturb write current there is used the back-injection current of normally operated neighbouring array parts.

7. A method as set forth in claim 1 wherein disturb write current is at least partly comprised of a dynamic current being supplied from one or more ac current sources.

8. A method as set forth in claim 1 wherein the cycle of said disturb write operation is chosen longer than a normal write operation in a full-select mode.

9. A method as set forth in claim 8 wherein said disturb write operation is performed over a time period sufficiently long to disturb cells along a defect-free word line but to keep cells along a defective word line undisturbed.

10. A method as set forth in claim 1 wherein the given storage state is a uniform distribution of similar binary digits.

11. A method as set forth in claim 1 comprising the steps of:

writing in a given word line along all bit addresses binary information of a state opposite to that of said given state, said checking step including reading the cell in said given word line which has been disturbed, and repeating this procedure for each of the remaining word lines.

12. A testing system for an array of cells located at intersections of word lines and bit lines comprising:

means for storing binary information in said cells in an initial storage state, means for energizing said word lines so as to place said word lines in a standby mode to maintain said cells in an unselected state, means for providing a disturb write current applied to said cells via associated bit lines while maintaining the corresponding word lines at standby potential during said standby mode, and means coupled to said cells for determining whether the memory cells of a given word line subjected to said disturb write current changed their initial storage state.

13. A testing system as set forth in claim 12 wherein said means for providing the disturb write current comprises a dc current source.

14. A testing system as set forth in claim 12 wherein said means for providing the disturb write current comprises an ac current source which is formed by dynamic effects exhibited by other word lines of said array.

* * * * *